United States Patent
Kawano et al.

(10) Patent No.: US 8,173,475 B2
(45) Date of Patent: May 8, 2012

(54) METHOD OF PRODUCING PHOTOELECTRIC CONVERSION DEVICE HAVING A MULTILAYER STRUCTURE FORMED ON A SUBSTRATE

(75) Inventors: Tetsuo Kawano, Ashigarakami-gun (JP); Takashi Koike, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/011,584

(22) Filed: Jan. 21, 2011

(65) Prior Publication Data
US 2011/0189816 A1 Aug. 4, 2011

(30) Foreign Application Priority Data
Jan. 29, 2010 (JP) .................... 2010-017657

(51) Int. Cl.
*H01L 21/00* (2006.01)
(52) U.S. Cl. ....... 438/57; 438/93; 438/95; 257/E31.001; 257/E31.002; 257/E31.027
(58) Field of Classification Search ............... 438/48, 438/57, 93, 95; 257/E31.001, E31.002, E31.032, 257/E31.027
See application file for complete search history.

(56) References Cited

U.S. PATENT DOCUMENTS

| | | | | |
|---|---|---|---|---|
| 5,859,397 A | * | 1/1999 | Ichinose et al. | 204/157.15 |
| 2008/0216895 A1 | * | 9/2008 | Aoki et al. | 136/265 |
| 2009/0194150 A1 | * | 8/2009 | Aoki | 136/252 |
| 2010/0078070 A1 | * | 4/2010 | Hosoya et al. | 136/256 |

FOREIGN PATENT DOCUMENTS

| | | |
|---|---|---|
| JP | 2004-015039 A | 1/2004 |
| JP | 4320529 B2 | 8/2009 |

OTHER PUBLICATIONS

M. Bär et al., "Chemical insights into the $Cd^{2+}/NH_3$ treatment—An approach to explain the formation of Cd-compounds on $Cu(In,Ga)(S,Se)_2$ absorbers", Solar Energy Materials & Solar cells, 2006, pp. 3151-3157, vol. 90, (2006).
Direct evidence of Cd diffusion into Cu (in, Ga) Se2 thin films during chemical-bath deposition process of CdS films; T. Nakada, et al., Applied Physics Letters, Apr. 26, 1999, vol. 74, No. 17, (Apr. 26, 1999).

* cited by examiner

*Primary Examiner* — Khiem D Nguyen
(74) *Attorney, Agent, or Firm* — Sughrue Mion, PLLC

(57) ABSTRACT

A method of producing a photoelectric conversion device having a multilayer structure formed on a substrate, the multilayer structure including a lower electrode, a photoelectric conversion layer made of a compound semiconductor layer, an n-type buffer layer made of a compound semiconductor layer, and a transparent conductive layer, is disclosed. A reaction solution, which is an aqueous solution containing an n-type dopant element, at least one of ammonia and an ammonium salt, and thiourea, is prepared, the n-type dopant is diffused into the photoelectric conversion layer by immersing the substrate including the photoelectric conversion layer in the reaction solution controlled to a temperature in the range from 20° C. to 45° C.; and the buffer layer is deposited on the photoelectric conversion layer by immersing the substrate including the photoelectric conversion layer subjected to the diffusion step in the reaction solution controlled to a temperature in the range from 70° C. to 95° C.

10 Claims, 3 Drawing Sheets

METHOD OF PRODUCING PHOTOELECTRIC CONVERSION DEVICE HAVING A MULTILAYER STRUCTURE FORMED ON A SUBSTRATE

BACKGROUND OF THE INVENTION

1. Field of the Invention

The present invention relates to a method of producing a photoelectric conversion device, which is used in solar batteries, CCD sensors, etc.

2. Description of the Related Art

Photoelectric conversion devices, which include a photoelectric conversion layer and electrodes electrically connected with the photoelectric conversion layer, are used in applications, such as solar batteries. The main stream of conventional solar batteries has been Si solar batteries, which use bulk single-crystal Si or polycrystal Si, or thin-film amorphous Si. On the other hand, compound semiconductor solar batteries, which do not depend on Si, are now being researched and developed. As the compound semiconductor solar batteries, those of a bulk type, such as GaAs solar batteries, etc., and those of a thin-film type, such as CIS or CIGS solar batteries, which contain a group Ib element, a group IIIb element and a group VIb element, are known. CI(G)S is a compound semiconductor represented by the general formula below:

$Cu_{1-z}In_{1-x}Ga_xSe_{2-y}S_y$ (wherein $0 \leq x \leq 1$, $0 \leq y \leq 2$, $0 \leq z \leq 1$), and it is a CIS semiconductor when $x=0$ or a CIGS semiconductor when $x>0$. The CIS and CIGS are collectively described herein as "CI(G)S".

Conventional thin-film type photoelectric conversion devices, such as CI(G)S photoelectric conversion devices, typically include a buffer layer between the photoelectric conversion layer and a transparent conductive layer (transparent electrode) formed above the photoelectric conversion layer. The buffer layer may be a CdS layer, or a ZnS layer which does not contain Cd, in view of environmental load. The buffer layer serves to achieve (1) prevention of recombination of photogenerated carrier, (2) control of band discontinuity, (3) lattice matching, (4) coverage of surface unevenness of the photoelectric conversion layer, etc. With respect to the CI(G)S photoelectric conversion devices, etc., which have relatively large surface unevenness of the photoelectric conversion layer, film formation may be achieved using CBD (Chemical Bath Deposition), which is a liquid phase process, in order to satisfy the condition (4) above.

Conventionally, it is reported that energy conversion efficiency of the photoelectric conversion layer is improved by diffusing n-type ions (if the buffer layer is made of CdS, the n-type ions are $Cd^{2+}$, or if the buffer layer is zinc-based, the n-type ions are $Zn^{2+}$) during formation of the buffer layer on the photoelectric conversion layer (the CBD process).

In the case where the buffer layer is formed using the CBD process, however, diffusion of the n-type ions, such as $Zn^{2+}$ or $Cd^{2+}$, and film formation of the buffer layer simultaneously progress. Therefore it is difficult to control both the thickness of the buffer layer and the amount of the diffused n-type ions to be optimal. It is believed that a larger amount of the diffused n-type ions results in a higher photoelectric conversion efficiency, and on the other hand, an excessively large thickness of the buffer layer results in degradation of the photoelectric conversion efficiency.

Japanese Patent No. 4320529 (hereinafter, Patent Document 1) states that, when the buffer layer is formed using the CBD process, diffusion of the Zn or Cd component and the film formation of the ZnS or CdS simultaneously progress, and this tends to cause variation in properties due to the crystal properties and the surface condition of the light-absorbing layer (the photoelectric conversion layer), and proposes a method for achieving optimal diffusion of the n-type dopant (the n-type ions) and optimal formation of the buffer layer at the same time. The method proposed in Patent Document 1 includes, for forming the buffer layer on the photoelectric conversion layer using the CBD process, a first step of diffusing the n-type dopant at an interface of the photoelectric conversion layer, a second step of forming a first buffer layer in a surface reaction rate-limited region, and a third step of forming a second buffer layer on the first buffer layer in a feed rate-limited region, thereby achieving both the optimal diffusion of the n-type dopant and the optimal formation of the buffer layer.

Further, it is taught in M. Bär et al., "Chemical insights into the $Cd^{2+}/NH_3$ treatment—An approach to explain the formation of Cd-compounds on Cu (In, Ga) (S, Se)$_2$ absorbers", Solar Energy Materials & Solar cells, Vol. 90, pp. 3151-3157, 2006 (hereinafter, Non-Patent Document 1) that, by forming the buffer layer using a gas-phase process after diffusion of the n-type ions using $Cd^{2+}/NH_3$ has been carried out using a liquid phase process, a higher photoelectric conversion efficiency can be achieved than that in the case where the diffusion of the n-type ions and the formation of the buffer layer are simultaneously carried out using the CBD process.

However, in the method disclosed in Patent Document 1, three processing steps are carried out from the diffusion to the formation of the buffer layer with changing the temperature to three different temperatures, and this requires complicated temperature control. Further, when the second stage of buffer layer formation is started after the first stage of diffusion, it is necessary to add a solution of a group VIb element, and this may result in a large apparatus configuration.

In the method disclosed in Non-Patent Document 1, the diffusion step is carried out in liquid phase and the buffer layer forming step is carried out in gas phase, and this inevitably results in a large apparatus configuration.

For practical application, it is desired to simplify the production process and equipment to reduce production costs.

SUMMARY OF THE INVENTION

In view of the above-described circumstances, the present invention is directed to providing a method of producing a photoelectric conversion device, which allows control of both the amount of the n-type dopant diffused into the photoelectric conversion layer and film formation of the buffer layer to be optimal, and also allows simplification of the production process and reduction of equipment costs.

An aspect of the method of producing a photoelectric conversion device of the invention is a method of producing a photoelectric conversion device having a multilayer structure formed on a substrate, the multilayer structure including a lower electrode, a photoelectric conversion layer made of a compound semiconductor layer, an n-type buffer layer made of a compound semiconductor layer, and a transparent conductive layer, the method including:

a step of preparing a reaction solution which is an aqueous solution containing an n-type dopant element, at least one of ammonia and an ammonium salt, and thiourea;

a diffusion step of diffusing the n-type dopant into the photoelectric conversion layer by immersing the substrate including the lower electrode and the photoelectric conversion layer formed thereon in the reaction solution controlled to a predetermined temperature in the range from 20° C. to 45° C.; and a deposition step of depositing the buffer layer on the photoelectric conversion layer by immersing the substrate including the lower electrode and the photoelectric conversion layer thereon subjected to the diffusion step in the reaction solution controlled to a predetermined temperature in the range from 70° C. to 95° C. (i.e., a buffer forming step using a CBD process).

The diffusion step and the deposition step may be carried out in the same reaction bath or in different reaction baths. If the diffusion step and the deposition step are carried out in different reaction baths, the same first reaction solution can repeatedly be used in the diffusion step to treat a plurality of substrates.

The treating time of the diffusion step may be in the range from 1 minute to 60 minutes.

As an element source of the n-type dopant element, at least one selected from the group of Cd sources consisting of cadmium sulfide, cadmium acetate, cadmium nitrate, cadmium citrate and hydrates thereof, or at least one selected from the group of Zn sources consisting of zinc sulfide, zinc acetate, zinc nitrate, zinc citrate and hydrates thereof may be used.

In the case where a Zn (S,O) layer is formed as the buffer layer, annealing may be carried out at a temperature in the range from 150° C. to 220° C. for a time in the range from 5 minutes to 90 minutes after the deposition step.

The main component of the photoelectric conversion layer may be at least one compound semiconductor having a chalcopyrite structure. The term "main component" herein refers to a component of not less than 20% by mass.

The main component of the photoelectric conversion layer may be at least one compound semiconductor containing at least one group Ib element selected from the group consisting of Cu and Ag, at least one group IIIb element selected from the group consisting of Al, Ga and In, and at least one group VIb element selected from the group consisting of S, Se, and Te.

The substrate may be an anodized substrate selected from the group consisting of: an anodized substrate provided by forming an anodized film which contains $Al_2O_3$ as the main component on at least one side of an Al substrate which contains Al as the main component; an anodized substrate provided by forming an anodized film which contains $Al_2O_3$ as the main component on at least one side of a composite substrate made of a Fe material which contains Fe as the main component and an Al material which contains Al as the main component combined on at least one side of the Fe material; and an anodized substrate provided by forming an anodized film which contains $Al_2O_3$ as the main component on at least one side of a substrate made of a Fe material which contains Fe as the main component and an Al film which contains Al as the main component formed on at least one side of the Fe material.

In the case where the substrate is a flexible substrate, the diffusion step and/or the deposition step may be carried out using a roll-to-roll process. In this case, a feed roll and a take-up roll may be disposed before and after each step, respectively, to carry out each step in a single roll-to-roll process, or a feed roll may be disposed upstream the diffusion step and a take-up roll may be disposed downstream the deposition step to carry out the diffusion step and the deposition step in a single roll-to-roll process. Further, one or more additional steps may be inserted between the feed roll and the take-up roll besides the diffusion step and the deposition step.

The method of producing a photoelectric conversion device of the invention is a method of producing a photoelectric conversion device having a multilayer structure formed on a substrate, the multilayer structure including a lower electrode, a photoelectric conversion layer made of a compound semiconductor layer, an n-type buffer layer made of a compound semiconductor layer, and a transparent conductive layer, and includes a diffusion step of diffusing the n-type dopant into the photoelectric conversion layer and a deposition step of depositing the buffer layer on the photoelectric conversion layer after the diffusion step. In the diffusion step, the temperature is controlled to a predetermined temperature in the range from 20° C. to 45° C., and therefore, the diffusion of the n-type dopant into the photoelectric conversion layer can achieved without causing deposition of the buffer layer. In the deposition step, it is only necessary to consider control of the optimal thickness of the buffer layer; however, in this step, further diffusion of the n-type dopant into the photoelectric conversion layer can also be expected.

By separating the diffusion step and the deposition step, both the amount of the n-type dopant (the n-type ions) diffused into the photoelectric conversion layer and the film formation of the buffer layer can be controlled to be optimal. In the case where these steps are separated to control both the diffusion and the deposition, it is typically conceived to carry out the diffusion step using a solution which does not contain any material for causing the deposition so that no deposition occurs during the diffusion step, as taught in Patent Document 1. However, the method using different solutions containing different components to carry out the diffusion step and the deposition step, as taught in Patent Document 1, requires an extra step of preparing the different solutions and extra equipment costs for carrying out the extra step. Further, since each step includes a temperature raising process, extra time (costs) for raising the temperature may be required.

According to the production method of the invention, although the diffusion step and the deposition step are managed as separate steps, both the steps are liquid phase processes and are carried out using the common reaction solution. Therefore, preparation and storage of the reaction solution used in these steps can be commonized, thereby allowing simplification of the production process and equipment costs. In view of practical application, these advantages lead to reduction of production costs and thus are very preferable.

DESCRIPTION OF THE PREFERRED EMBODIMENTS

Hereinafter, the present invention will be described in detail.

First, a typical structure of a photoelectric conversion device, which is produced by a method of producing a photoelectric conversion device of the invention, is described with reference to the drawings.

Figure 1:
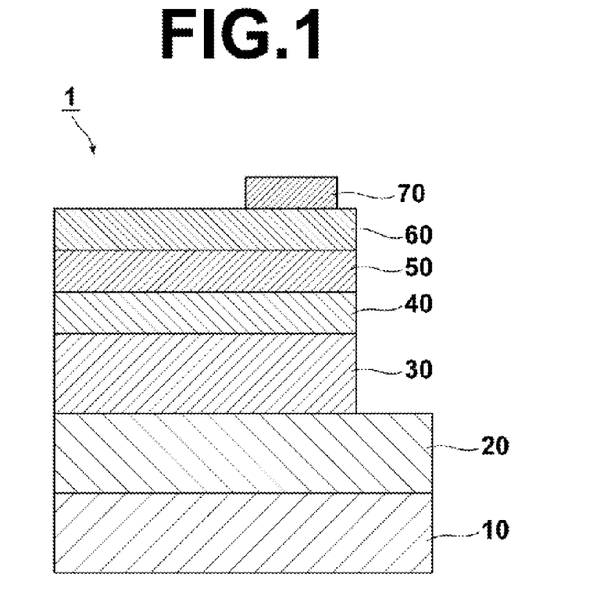
FIG. 1 is a schematic sectional view illustrating one example of a photoelectric conversion device, which is produced by a method of producing a photoelectric conversion device of the invention.

FIG. 1 is a schematic sectional view of the photoelectric conversion device. For ease of visual recognition, elements shown in the drawing are not to scale.

The photoelectric conversion device 1 includes a lower electrode (back electrode) 20, a photoelectric conversion layer 30, a buffer layer 40, a window layer 50, a transparent conductive layer (transparent electrode) 60 and an upper electrode (grid electrode) 70, which are sequentially formed on a substrate 10.

The method of producing a photoelectric conversion device of the invention is to produce a photoelectric conversion device which has a multilayer structure including at least the lower electrode 20, the photoelectric conversion layer 30 made of a compound semiconductor layer, the n-type buffer layer 40 made of a compound semiconductor layer, and the transparent conductive layer 60, formed on the substrate 10, as with the photoelectric conversion device 1 shown in FIG. 1. The method of producing a photoelectric conversion device of the invention includes a step of preparing a reaction solution which is an aqueous solution containing an n-type dopant element, at least one of ammonia and an ammonium salt, and thiourea; a diffusion step of diffusing the n-type dopant into the photoelectric conversion layer 30 by immersing the substrate 10 including the lower electrode 20 and the photoelectric conversion layer 30 formed thereon in the reaction solution controlled to a predetermined temperature in the range from 20° C. to 45° C.; and a deposition step of depositing the buffer layer 40 on the photoelectric conversion layer 30 by immersing the substrate 10 including the lower electrode 20 and the photoelectric conversion layer 30 thereon subjected to the diffusion step in the reaction solution controlled to a predetermined temperature in the range from 70° C. to 95° C.

The n-type dopant element is a metal element, which is Cd or Zn. During the diffusion step, $Cd^{2+}$ or $Zn^{2+}$ is diffused as the n-type dopant into the photoelectric conversion layer, and this metal element also serves as a constituent element forming the buffer layer during the deposition step.

As the buffer layer, at least one selected from CdS, ZnS, Zn (S,O) and Zn (S, O, OH) is formed.

For example, if a CdS layer is formed as the buffer layer, the n-type dopant element is Cd. As the Cd source, at least one selected from the group consisting of cadmium sulfide, cadmium acetate, cadmium nitrate, cadmium citrate and hydrates thereof may be used. If a Zn (S,O) or ZnS layer is formed as the buffer layer, the n-type dopant element is Zn. As the Zn source, at least one selected from the group consisting of zinc sulfide, zinc acetate, zinc nitrate, zinc citrate and hydrates thereof may be used.

In the invention, the deposition step is achieved by a so-called CBD (chemical bath deposition) process. The CBD process is a method for depositing crystals on a substrate at an appropriate rate in a stable environment by forming a complex of a metal ion M using a reaction solution, which is a metal ion solution having a concentration and a pH value to achieve a supersaturated condition in equilibrium as represented by the following general formula:

wherein M represents a metal element, L represents a ligand, each of m, n and i represents a positive number.

In the deposition step, the concentration of each component in the reaction solution is not particularly limited as long as deposition of the buffer layer is achieved, and it may be determined as appropriate depending on the type of the buffer layer.

For example, if the buffer layer is made of CdS, the concentration of the n-type dopant element (which is Cd in this case) may be about 0.00001 to 1 M, the concentration of ammonia or an ammonium salt may be about 0.01 to 5 M, and the concentration of thiourea may be about 0.001 to 1 M.

If the buffer layer is made of Zn (S,O) or Zn (S,O,OH), the concentration of the n-type dopant element (which is Zn in this case) may be about 0.001 to 0.5 M, the concentration of ammonia or an ammonium salt may be about 0.001 to 0.40 M or may optionally be about 0.01 to 0.30 M, and the concentration of thiourea may be about 0.01 to 1.0 M. Further, in this case, the reaction solution may contain a citrate compound (sodium citrate and/or a hydrate thereof). The citrate compound contained in the reaction solution promotes formation of a complex and allows good control of crystal growth in the CBD reaction, thereby allowing stable film formation.

The citrate compound may also be contained in the reaction solution, as necessary, in the case where the buffer layer is CdS-based.

In the production method of the invention, the diffusion step is carried out at a predetermined temperature in the range from 20° C. to 45° C. to diffuse the n-type dopant (the n-type ions) into the photoelectric conversion layer. During this diffusion step, the buffer layer is not deposited. If the temperature of the reaction solution is less than 20° C., the diffusion rate of the n-type ions into the photoelectric conversion layer decreases, and it is difficult to ensure a desired amount of diffused n-type ions within a practical reaction time. If the temperature of the reaction solution exceeds 45° C., the buffer layer may be deposited. On the other hand, during the deposition step, it is believed that further diffusion of the n-type ions into the photoelectric conversion layer occurs at the same time. It is believed that a larger amount of the n-type ions diffused into the photoelectric conversion layer has higher contribution to improvement of the photoelectric conversion rate. Therefore, there is no problem with the diffusion occurring during the deposition step. With respect to the deposition step, if the temperature of the reaction solution is less than 70° C., the reaction rate decreases, and the buffer layer does not grow or, even if the buffer layer grows, it is difficult to provide a desired thickness (for example, 50 nm or more) at a practical reaction rate. On the other hand, if the reaction temperature exceeds 95° C., bubble formation, etc., in the reaction solution increases, and the bubbles, etc., may adhere to the film surface to hinder growth of a flat and uniform film. In addition, if the reaction is carried out with an open system, the concentration, etc., may change due to evaporation of the solvent, etc., and it is difficult to maintain a stable deposition condition of the thin film. The reaction temperature may optionally be in the range from 80 to 90° C.

If the substrate is a flexible substrate, the diffusion step and/or the deposition step may be carried out using a so-called roll-to-roll process, which uses a feed roll, on which a long flexible substrate is wound, and a take-up roll, which takes up the substrate after the film formation.

Now, one example of a production apparatus for carrying out the production method according to the embodiment of the invention using the roll-to-roll process is described.

In this example, using a long flexible substrate as the substrate 10, an embodiment of a process including the diffusion of the n-type dopant into the photoelectric conversion layer and the formation the buffer on the photoelectric conversion layer, which are carried out on the substrate 10 having the lower electrode 20 and the photoelectric conversion layer 30 made of a compound semiconductor layer formed thereon, is described.

Figure 2:
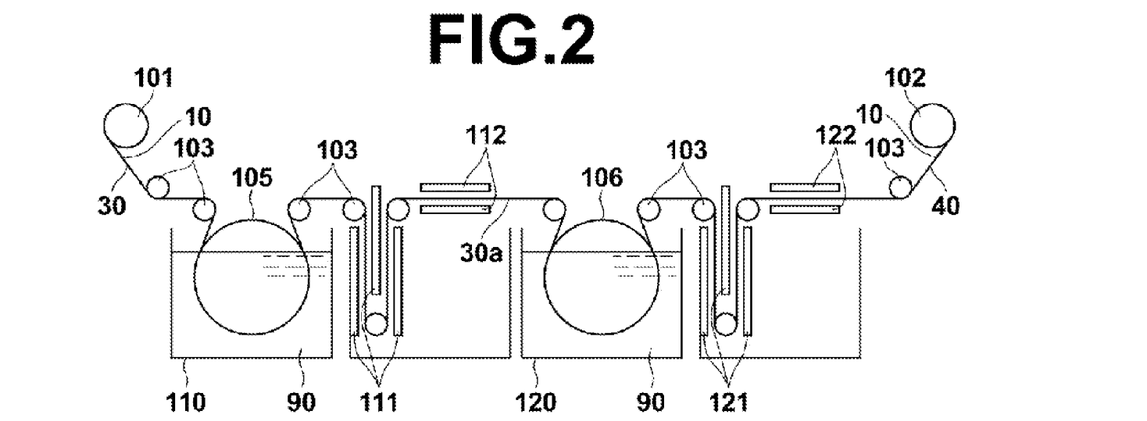
FIG. 2 is a diagram illustrating one example of a production apparatus for carrying out the method of producing a photoelectric conversion device of the invention.

FIG. 2 illustrates the schematic configuration of the production apparatus. The production apparatus includes: a reaction bath 110 for the diffusion step; a reaction bath 120 for the deposition step; and water showers 111 and 121 and hot-air dryers 112 and 122, which are respectively disposed downstream the reaction baths 110 and 120 for washing and drying the substrate after each of the diffusion step and the deposition step. For production using the roll-to-roll process, the production apparatus further includes: a feed roll 101 for feeding the substrate disposed upstream the reaction bath 110 for the diffusion step; a take-up roll 102 for taking up the substrate having the buffer layer formed thereon disposed downstream the reaction bath 120 for the deposition step; guide rolls 103 for guiding the substrate fed from the feed roll 101 sequentially through the steps of diffusion, washing, drying, deposition, washing and drying; and drums 105 and 106 disposed in the reaction baths 110 and 120, respectively, for immersing each area to be treated of the substrate in each reaction bath.

The substrate 10 having the photoelectric conversion layer formed thereon is wound on the feed roll 101. The substrate 10 is fed from the feed roll 101 to the diffusion step, and after the buffer layer has been formed on the substrate 10 through the above-described steps, the substrate 10 is taken up on the take-up roll 102.

Each of the reaction baths 110 and 120 includes a temperature controlling means (not shown), which includes a heater, a temperature sensor, etc., so that the temperature of the reaction solution in each reaction bath can be controlled to a desired temperature.

A reaction solution 90, which is an aqueous solution containing the n-type dopant element, at least one of ammonia and an ammonium salt, and thiourea, is prepared in advance, and the reaction solution 90 is poured in the reaction bath 110 for the diffusion step and the reaction bath 120 for the deposition step.

The substrate 10 having the photoelectric conversion layer formed thereon fed from the feed roll 101 is guided by the guide rolls 103 so that each area to be treated is sequentially treated in each step.

First, the substrate 10 is immersed in the reaction solution 90 controlled to a predetermined temperature in the range from 20° C. to 45° C. in the reaction bath 110 to diffuse the n-type dopant into the photoelectric conversion layer 30. The treating time of the diffusion step may be in the range from 1 minute to 60 minutes. If the treating time is less than 1 minute, it is difficult to achieve a desired amount of the diffused n-type dopant. On the other hand, a treating time exceeding 60 minutes is not practical.

After the diffusion, the substrate 10 having the photoelectric conversion layer 30a on the surface thereof subjected to the diffusion step is washed and dried, and then, is immersed in the reaction solution 90 controlled to a predetermined temperature in the range from 70° C. to 95° C. in the reaction bath 120 to deposit the buffer layer 40 on the photoelectric conversion layer 30a.

Thereafter, substrate 10 is washed and dried, and is taken up by the take-up roll 102.

The substrate 10 having the buffer layer 40 formed thereon and taken up by the take-up roll 102 is then subjected to steps of forming the window layer, the transparent conductive layer, an extraction electrode, etc., to produce the photoelectric conversion device in the form of a cell.

A surface treatment using KCN, or the like, for removing impurities, etc., from the surface of the photoelectric conversion layer may be carried out before or after the diffusion of the n-type dopant into the photoelectric conversion layer.

The treatment carried out in each of the above-described steps is applied to each area to be treated of the long substrate. Since the components of the reaction solution are scarcely changed by a single diffusion step, the same reaction solution can repeatedly be used in the diffusion step for a plurality of times. On the other hand, in the deposition step, the concentrations of the components in the reaction solution that are deposited as the buffer layer significantly change, and therefore it is necessary to replace the reaction solution for each area to be treated.

In the case where a Zn(S,O) layer is deposited as the buffer layer, annealing at a temperature in the range from 150° C. to 220° C. may be carried out for a time in the range from 5 minutes to 90 minutes after the deposition step. This annealing can improve the photoelectric conversion efficiency compared to the case where no annealing is applied.

Figure 3:
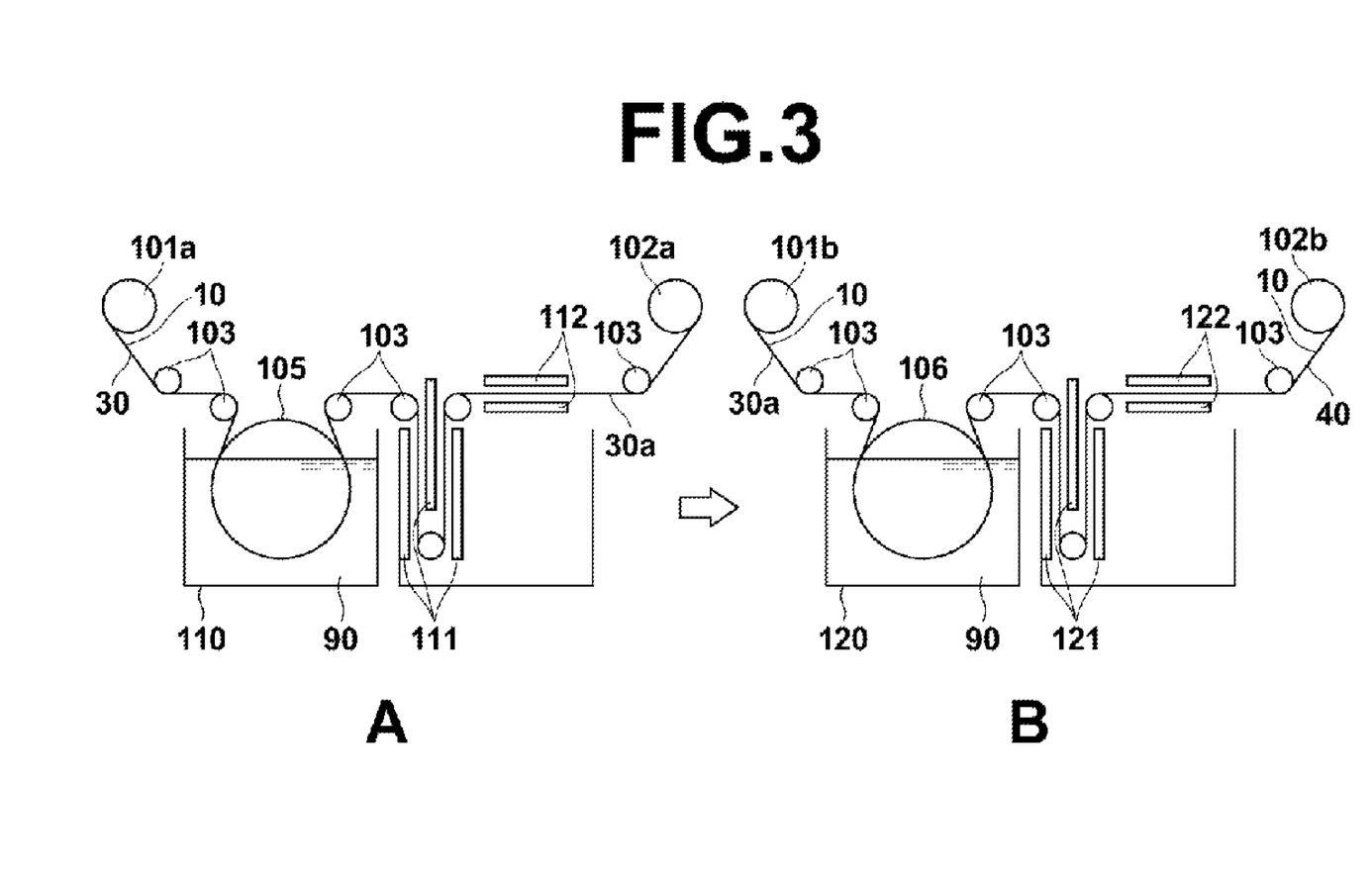
FIG. 3 is a diagram illustrating a modified example of the production apparatus for carrying out the method of producing a photoelectric conversion device of the invention.

FIG. 3 illustrates a modified example of the production apparatus.

The above-described production apparatus shown in FIG. 2 includes the feed roll and the take-up roll disposed upstream the diffusion step and downstream the deposition step, respectively. As shown at A and B in FIG. 3, the production apparatus may include feed rolls 101a and 101b and take-up rolls 102a and 102b which are disposed upstream and downstream of each step, respectively. In this case, the substrate 10 having the photoelectric conversion layer 30 formed on the surface thereof is taken up by the take-up roll 102a after the diffusion step shown at A in FIG. 3, and the take-up roll 102a is used as the feed roll 101b for feeding the substrate 10 having the photoelectric conversion layer 30 on the surface thereof subjected to the diffusion step to the deposition step shown at B in FIG. 3.

Alternatively, the apparatus may include only one of the components shown at A and B FIG. 3, and may use the same reaction bath 110 to carry out both the diffusion step and the deposition step.

In the case where the same reaction bath 110 is used to carry out the both steps, the reaction solution 90 in the reaction bath 110 is controlled to a predetermined temperature in the range from 20° C. to 45° C., and then, the substrate 10 having the photoelectric conversion layer 30 is immersed in the reaction solution 90 to achieve the diffusion. After the diffusion, the substrate 10 is once taken out from the reaction solution. Then, the reaction solution 90 is controlled to a predetermined temperature in the range from 70° C. to 95° C., and then, the substrate 10, which has been subjected to the diffusion, is immersed in the reaction solution to achieve the deposition. In this case, the reaction solution 90 is continuously used in the diffusion step and the deposition step.

Although the case where the diffusion of the n-type dopant into the photoelectric conversion layer and the formation of the buffer layer are achieved using the roll-to-roll process is described above, other steps, such as the surface treatment to remove impurities from the surface of the photoelectric conversion layer before the diffusion and formation of the other layers, such as the window layer and the transparent electrode layer, on the buffer layer may be carried out continuously in a single roll-to-roll process or by using a roll-to-roll process for each step.

Now, details of the individual layers of the photoelectric conversion device 1, which is produced by the production method of the invention, are described.

Substrate

Figure 4:
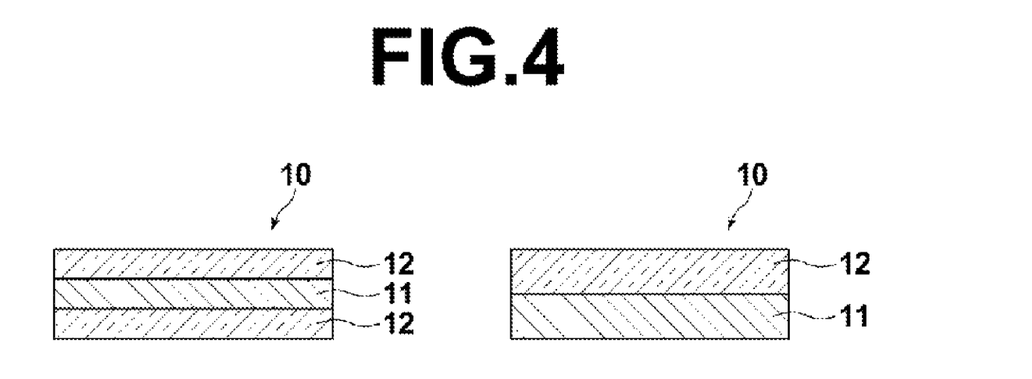
FIG. 4 is a schematic sectional view illustrating the structures of examples of an anodized substrate.

FIG. 4 is a schematic sectional view of examples of the substrate 10. The substrate 10 is provided by anodizing at least one side of a substrate 11. The substrate 11 may be an Al substrate which contains Al as the main component, a composite substrate made of a Fe material (such as SUS), which contains Fe as the main component, combined with an Al material which contains Al as the main component on at least one side thereof, or a substrate made of a Fe material which contains Fe as the main component, with an Al film which contains Al as the main component formed on at least one side thereof.

The substrate 10 may include anodized films 12 formed on opposite sides of the substrate 11, as shown on the left in FIG. 4, or may include an anodized film 12 formed on one side of the substrate 11, as shown on the right in FIG. 4. The anodized film 12 contains $Al_2O_3$ as the main component. In view of suppression of warping of the substrate due to a difference of coefficient of thermal expansion between Al and $Al_2O_3$ and peel-off of the film during a device production process, the substrate 10 including the anodized films 12 formed on the opposite sides of the substrate 11, as shown on the left in FIG. 4, may be used.

The anodization is achieved by immersing the substrate 11, which serves as an anode, with a cathode in an electrolytic solution, and applying a voltage between the anode and the cathode. The surface of the substrate 11 may be subjected to a washing treatment and/or a polishing/smoothing treatment, as necessary, before the anodization. As the cathode, carbon or Al, for example, may be used. The electrolyte is not particularly limited, and an example thereof may be an acidic electrolytic solution that contains one or two or more acids, such as sulfuric acid, phosphoric acid, chromic acid, oxalic acid, sulfamic acid, benzenesulfonic acid and/or amidosulfonic acid.

Anodization conditions depend on the type of the electrolyte used, and are not particularly limited. For example, suitable anodization conditions may be as follows: an electrolyte concentration in the range from 1 to 80% by mass, a solution temperature in the range from 5 to 70° C., an electric current density in the range from 0.005 to 0.60 A/cm², a voltage in the range from 1 to 200 V, and an electrolysis time in the range from 3 to 500 minutes.

Examples of the electrolyte may include sulfuric acid, phosphoric acid, oxalic acid, or a mixture thereof. When such an electrolyte is used, the electrolyte concentration may be in the range from 4 to 30% by mass, the solution temperature may be in the range from 10 to 30° C., the electric current density may be in the range from 0.05 to 0.30 A/cm², and the voltage may be in the range from 30 to 150 V.

The thickness of the substrate 11 and the anodized film 12 are not particularly limited. In view of mechanical strength and thickness and weight reduction of the substrate 10, the thickness of the substrate 11 before anodized may, for example, be in the range from 0.05 to 0.6 mm, or may optionally be in the range from 0.1 to 0.3 mm. In view of insulation, mechanical strength, and thickness and weight reduction of the substrate, the thickness of the anodized film 12 may, for example, be in the range from 0.1 to 100 μm.

Further, the substrate 10 may include a soda-lime glass (SLG) layer on the anodized film 12. The soda-lime glass layer serves to diffuse Na into the photoelectric conversion layer. If the photoelectric conversion layer contains Na, the photoelectric conversion efficiency is further improved.

Lower Electrode

The main component of the lower electrode (back electrode) 20 is not particularly limited; however, it may be Mo, Cr, W or a combination thereof, in particular, Mo, etc. The thickness of the lower electrode (back electrode) 20 is not particularly limited; however, it may be in the range from about 200 to 1000 nm.

Photoelectric Conversion Layer

The main component of the photoelectric conversion layer 30 is not particularly limited; however, in view of provision of high photoelectric conversion efficiency, it may be at least one compound semiconductor having a chalcopyrite structure, in particular, at least one compound semiconductor containing a group Ib element, a group IIIb element and a group VIb element.

The main component of the photoelectric conversion layer 30 may be at least one compound semiconductor containing:

at least one group Ib element selected from the group consisting of Cu and Ag, at least one group IIIb element selected from the group consisting of Al, Ga and In, and at least one group VIb element selected from the group consisting of S, Se, and Te.

Examples of the compound semiconductor include:

$CuAlS_2$, $CuGaS_2$, $CuInS_2$, $CuAlSe_2$, $CuGaSe_2$, $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In,Al)Se_2$, $Cu(In, Ga)(S,Se)_2$, $Cu_{1-z}In_{1-x}Ga_xSe_{2-y}S_y$ (wherein $0 \leq x \leq 1$, $0 \leq y \leq 2$, $0 \leq z \leq 1$) (CI(G)S), $Ag(In, Ga)Se_2$, and $Ag(In, Ga)(S, Se)_2$.

The thickness of the photoelectric conversion layer 30 is not particularly limited; however, it may be in the range from 1.0 to 3.0 μm, or may optionally be in the range from 1.5 to 2.0 μm.

(Buffer Layer)

The buffer layer 40 is an n-type semiconductor, which is made of a layer containing CdS, ZnS, Zn (S,O) or Zn (S,O, OH), in particular, CdS, ZnS or Zn (S,O), as the main component. The thickness of the buffer layer 40 is not particularly limited; however, it may be in the range from 10 nm to 2 μm, or may optionally be in the range from 15 to 200 nm.

Window Layer

The window layer 50 is an intermediate layer serves to take in light. The composition of the window layer 50 is not particularly limited; however, it may be i-ZnO, etc. The thickness of the window layer 50 is not particularly limited; however, it may be in the range from 10 nm to 2 μm, or may optionally be in the range from 15 to 200 nm. The window layer is optional, i.e., the photoelectric conversion device may not include the window layer 50.

Transparent Conductive Layer

The transparent conductive layer (transparent electrode) 60 serves to take in light and also serves as an electrode, which forms a pair with the lower electrode 20 and the electric current generated at the photoelectric conversion layer 30 flows therethrough. The composition of the transparent conductive layer 60 is not particularly limited; however, it may be n-ZnO, such as ZnO:Al, etc. The thickness of the transparent conductive layer 60 is not particularly limited; however, it may be in the range from 50 nm to 2 μm.

Upper Electrode

The main component of the upper electrode 70 is not particularly limited; however, it may be Al, etc. The thickness of the upper electrode 70 is not particularly limited; however, it may be in the range from 0.1 to 3 μm.

The photoelectric conversion device 1 is preferably applicable to solar batteries. A solar battery can be formed by attaching a cover glass, a protective film, etc., to the photoelectric conversion device 1, as necessary.

The photoelectric conversion device produced according to the production method of the invention is applicable not only to solar batteries but also to other applications, such as CCDs.

EXAMPLES

Devices having the same layer structure as that of the photoelectric conversion device shown in FIG. 1 were produced in different manners as shown in Examples 1 to 3 and Comparative Examples 1 to 5, and photoelectric conversion efficiency of each device was evaluated.

Formation of Part from Substrate to Photoelectric Conversion Layer

A substrate used in each of Examples 1 to 3 and Comparative Examples 1 to 5 was an anodized substrate, which was made of a composite substrate of stainless steel (SUS) and Al provided with an aluminum anodized film (AAO) formed on the Al surface thereof, and was further provided with a soda-lime glass (SLG) layer formed on the surface of the AAO. The thicknesses of the individual layers of the substrate were as follows: the SUS layer had a thickness over 300 μm, the Al layer had a thickness of 300 μm, the AAO layer had a thickness of 20 μm, and the SLG layer had a thickness of 0.2 μm.

A 0.8 μm-thick Mo lower electrode was formed through sputtering on the SLG layer. Then, a 1.8 μm-thick $Cu(In_{0.7}Ga_{0.3})Se_2$ layer was formed as the photoelectric conversion layer on the Mo lower electrode using a three-stage process, which is known as one of film formation processes to form a CIGS layer.

Preparation of Reaction Solution 1

A reaction solution 1 ($CdSO_4$: 0.0001 M, thiourea: 0.10 M, ammonia: 2.0 M) was prepared by mixing predetermined amounts of an aqueous $CdSO_4$ solution, an aqueous thiourea solution and an aqueous ammonia solution. It should be noted that, in the case where the reaction solution 1 is used, a CdS layer is deposited as the buffer layer.

The unit "M" represents molar concentration (mol/L).

Preparation of Reaction Solution 2

A reaction solution 2 ($ZnSO_4$: 0.03 M, thiourea: 0.05 M, sodium citrate: 0.03 M, ammonia: 0.15 M) was prepared by mixing predetermined amounts of an aqueous $ZnSO_4$ solution, an aqueous thiourea solution, a sodium citrate solution and an aqueous ammonia solution. It should be noted that, in the case where the CBD process is carried out using the reaction solution 2, finally a Zn (S,O) layer can be formed as the buffer layer by applying annealing, etc., as necessary.

The diffusion step and the deposition step carried out in each of Examples and Comparative Examples are described below.

In Examples 1 to 3 and Comparative Examples 2 to 4, the diffusion step and the deposition step were sequentially carried out in the same reaction bath. Specifically, the diffusion step was carried out by immersing the substrate in the reaction bath containing the reaction solution controlled to the diffusion temperature, and the substrate having the n-type dopant diffused therein was once taken out from the reaction bath. Then, the reaction solution in the reaction bath was controlled to the deposition temperature, and the deposition step was carried out by immersing the substrate in the same reaction bath.

In Examples 1 and 2 and Comparative Examples 1 to 4, a CdS layer was deposited as the buffer layer. In Example 3 and Comparative Example 5, a Zn (S,O) was formed as the buffer layer.

Example 1

Diffusion step: the substrate having the photoelectric conversion layer formed thereon was immersed for 15 minutes in the reaction bath containing the reaction solution 1 controlled to a temperature of 40° C. to diffuse Cd ions into the photoelectric conversion layer.

Deposition step: the substrate subjected to the diffusion step was immersed for 15 minutes in the reaction bath containing the reaction solution 1 controlled to a temperature of 85° C. to deposit a CdS buffer layer.

Example 2

Diffusion step: the substrate having the photoelectric conversion layer formed thereon was immersed for 60 minutes in the reaction bath containing the reaction solution 1 controlled to a temperature of 40° C. to diffuse Cd ions into the photoelectric conversion layer.

Deposition step: the substrate subjected to the diffusion step was immersed for 15 minutes in the reaction bath containing the reaction solution 1 controlled to a temperature of 85° C. to deposit a CdS buffer layer.

Example 3

Diffusion step: the substrate having the photoelectric conversion layer formed thereon was immersed for 15 minutes in the reaction bath containing the reaction solution 2 controlled to a temperature of 40° C. to diffuse Zn ions into the photoelectric conversion layer.

Deposition step (buffer forming step): the substrate subjected to the diffusion step was immersed for 60 minutes in the reaction bath containing the reaction solution 2 controlled to a temperature of 90° C., and then was annealed at 200° C. for 60 minutes to form a Zn(S,O) buffer layer.

Comparative Example 1

No diffusion step was carried out.

Deposition step: the substrate having the photoelectric conversion layer formed thereon was immersed for 15 minutes in the reaction bath containing the reaction solution 1 controlled to a temperature of 85° C. to deposit a CdS buffer layer.

Comparative Example 2

Diffusion step: the substrate having the photoelectric conversion layer formed thereon was immersed for 60 minutes in the reaction bath containing the reaction solution 1 controlled to a temperature of 15° C. to diffuse Cd ions into the photoelectric conversion layer.

Deposition step: the substrate subjected to the diffusion step was immersed for 15 minutes in the reaction bath containing the reaction solution 1 controlled to a temperature of 85° C. to deposit a CdS buffer layer.

Comparative Example 3

Diffusion step: the substrate having the photoelectric conversion layer formed thereon was immersed for 60 minutes in the reaction bath containing the reaction solution 1 controlled to a temperature of 60° C. to diffuse Cd ions into the photoelectric conversion layer.

Deposition step: the substrate subjected to the diffusion step was immersed for 15 minutes in the reaction bath containing the reaction solution 1 controlled to a temperature of 85° C. to deposit a CdS buffer layer.

Comparative Example 4

Diffusion step: the substrate having the photoelectric conversion layer formed thereon was immersed for 30 minutes in the reaction bath containing the reaction solution 1 controlled to a temperature of 80° C. to diffuse Cd ions into the photoelectric conversion layer.

Deposition step: the substrate subjected to the diffusion step was immersed for 15 minutes in the reaction bath containing the reaction solution 1 controlled to a temperature of 85° C. to deposit a CdS buffer layer.

Comparative Example 5

No diffusion step was carried out.

Deposition step (buffer forming step): the substrate having the photoelectric conversion layer formed thereon was immersed for 60 minutes in the reaction bath containing the reaction solution 2 controlled to a temperature of 90° C., and then, was annealed at 200° C. for 60 minutes to form a Zn(S,O) buffer layer.

Production of Solar Batteries

For each of the devices having the buffer layer formed in the manners of Examples 1 to 3 and Comparative Examples 1 to 5, an i-ZnO layer (the window layer) and an n-ZnO layer (the transparent electrode layer) were sequentially formed on the buffer layer, and finally an extraction electrode (the upper electrode) made of Al was formed thereon to produce a single cell solar battery. The thicknesses of the individual layers were as follows: the i-ZnO layer had a thickness of 50 nm, the n-ZnO layer had a thickness of 300 nm, and the Al layer had a thickness of 1 μm.

Measurement of Conversion Efficiency

For each of the solar batteries produced in the manners of Examples 1 to 3 and Comparative Examples 1 to 5, energy conversion efficiency was measured using light from a solar simulator (Air Mass (AM)=1.5, 100 mW/cm$^2$).

Table 1 shows resulting values of conversion efficiency with details of the diffusion step and the deposition step of Examples 1 to 3 and Comparative Examples 1 to 5.

The values of the conversion efficiency shown in the table are ratios to a reference value, which is the photoelectric conversion efficiency of the device that was produced by carrying out the deposition step without carrying out the diffusion step. Since the conversion efficiency depends on the composition of the buffer layer, the values of conversion efficiency of Examples 1 and 2 and Comparative Examples 2 to 4 reference the conversion efficiency of Comparative Example 1, and the value of conversion efficiency of Example 3 references the conversion efficiency of Comparative Example 5.

TABLE 1

| | | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Diffusion Step | Type of Reaction Solution | Reaction Solution 1 | Reaction Solution 1 | Reaction Solution 2 | No Diffusion Step | Reaction Solution 1 | Reaction Solution 1 | Reaction Solution 1 | No Diffusion Step |
| | Temperature | 40° C. | 40° C. | 40° C. | | 15° C. | 60° C. | 80° C. | |
| | Treating Time | 15 minutes | 60 minutes | 60 minutes | | 60 minutes | 60 minutes | 30 minutes | |
| Buffer Layer Deposition Step | Buffer Layer | CdS | CdS | Zn(S, O) | CdS | CdS | CdS | CdS | Zn(S, O) |
| | Type of Reaction Solution | Reaction Solution 1 | Reaction Solution 1 | Reaction Solution 2 | Reaction Solution 1 | Reaction Solution 1 | Reaction Solution 1 | Reaction Solution 1 | Reaction Solution 2 |
| | Temperature | 85° C. | 85° C. | 90° C. | 85° C. | 85° C. | 85° C. | 85° C. | 90° C. |
| | Treating Time | 15 minutes | 15 minutes | 60 minutes | 15 minutes | 15 minutes | 15 minutes | 15 minutes | 60 minutes |
| Conversion Efficiency in the Form of Cell (Ratio to Reference) | Ratio to Reference 1 | +0.8% | +1.7% | — | Reference 1 | +0.2% | −0.9% | −2.5% | — |
| | Ratio to Reference 2 | — | — | +3.2% | — | — | — | — | Reference 2 |

As shown in Table 1, the solar batteries of Examples 1 and 2 of the invention, which were produced by carrying out the diffusion of Cd into the photoelectric conversion layer and the deposition of the CdS buffer layer, had a conversion efficiency greater by 0.8% or more than that of the solar battery which was produced by carrying out the deposition of CdS without carrying out the diffusion step (Comparative Example 1).

The solar battery of Comparative Example 2 had a higher conversion efficiency than that of the solar battery of Comparative Example 1, which was produced by carrying out the deposition of CdS without carrying out the diffusion step. However, it is believed that sufficient diffusion was not achieved since the temperature during the diffusion step was as low as 15° C. The solar batteries of Comparative Examples 3 and 4 were produced with the temperature during the diffusion step as high as 60° C. or 80° C., and therefore, it is believed that deposition of CdS occurred during the diffusion step and this resulted in an excessively thick CdS buffer layer, causing degradation of the conversion efficiency.

Further, the solar battery of Example 3, which was produced by carrying out the diffusion of Zn into the photoconductive layer and the formation of the Zn (S,O) buffer layer, had a largely improved conversion efficiency (improved by 3.2%) compared to the conversion efficiency of the solar battery which was produced by forming the Zn (S,O) buffer layer without carrying out the diffusion step (Comparative Example 5).

What is claimed is:

1. A method of producing a photoelectric conversion device having a multilayer structure formed on a substrate, the multilayer structure including a lower electrode, a photoelectric conversion layer made of a compound semiconductor layer, an n-type buffer layer made of a compound semiconductor layer, and a transparent conductive layer, the method comprising:

a step of preparing a reaction solution comprising an aqueous solution containing an n-type dopant element, at least one of ammonia and an ammonium salt, and thiourea;

a diffusion step of diffusing the n-type dopant into the photoelectric conversion layer by immersing the substrate including the lower electrode and the photoelectric conversion layer formed thereon in the reaction solution controlled to a predetermined temperature in a -range from 20° C. to 45° C.; and a deposition step of depositing the buffer layer on the photoelectric conversion layer by immersing the substrate including the lower electrode and the photoelectric conversion layer subjected to the diffusion step in the reaction solution controlled to a predetermined temperature in a range from 70° C. to 95° C.

2. The method as claimed in claim 1, wherein the diffusion step and the deposition step are carried out in an identical reaction bath.

3. The method as claimed in claim 1, wherein the diffusion step and the deposition step are carried out in different reaction baths.

4. The method as claimed claim 1, wherein a treating time of the diffusion step is within a range from 1 minute to 60 minutes.

5. The method as claimed in claim 1, wherein, as an element source of the n-type dopant element, at least one selected from the group consisting of cadmium sulfide, cadmium acetate, cadmium nitrate, cadmium citrate and hydrates thereof, or at least one selected from the group consisting of zinc sulfide, zinc acetate, zinc nitrate, zinc citrate and hydrates thereof is used.

6. The method as claimed in claim 1, wherein, if a Zn(S,O) layer is formed as the buffer layer, annealing is carried out at a temperature in a range from 150° C. to 220° C. for a time in a range from 5 minutes to 90 minutes after the deposition step.

7. The method as claimed in claim 1, wherein a main component of the photoelectric conversion layer is at least one compound semiconductor having a chalcopyrite structure.

8. The method as claimed in claim 6, wherein a main component of the photoelectric conversion layer is at least one compound semiconductor containing at least one group Ib element selected from the group consisting of copper (cu) and silver (Ag), at least one group IIIb element selected from the group consisting of aluminum (Al), gallium (Ga), and, Indium (In) and at least one group VIb element selected from the group consisting of sulphr (S), selenium (Se), and tellurium (Te).

9. The method as claimed in claim 1, wherein the substrate comprises an anodized substrate selected from the group consisting of:

an anodized substrate provided by forming an anodized film which contains Al2O3 as the main component on at least one side of an aluminum (Al) substrate which contains aluminum (Al) as a main component;

an anodized substrate provided by forming an anodized film which contains Al2O3 as a main component on at least one side of a composite substrate made of an iron (Fe) material which contains iron (Fe) as a main component and an aluminum (Al) material which contains aluminum (Al) as a main component combined on at least one side of the iron (Fe) material; and an anodized substrate provided by forming an anodized film which contains Al2O3 as the a main component on at least one side of a substrate made of an iron (Fe) material which contains iron (Fe) as a main component and an aluminum (AL) film which contains aluminum (Al) as a main component formed on at least one side of the iron (Fe) material.

10. The method as claimed in claim 1, wherein the substrate is a flexible substrate, and the diffusion step and/or the deposition step are carried out using a roll-to-roll process.

* * * * *